(12) United States Patent
Jin (10) Patent No.: US 9,232,287 B2
(45) Date of Patent: Jan. 5, 2016

(54) METHOD AND APPARATUS FOR PROCESSING DOWNLINK FRAME SYNCHRONIZATION IN GIGABIT-CAPABLE PASSIVE OPTICAL NETWORK SYSTEM

(75) Inventor: Jun Jin, Shenzhen (CN)

(73) Assignee: ZTE CORPORATION (CN)

( * ) Notice: Subject to any disclaimer, the term of this patent is extended or adjusted under 35 U.S.C. 154(b) by 163 days.

(21) Appl. No.: 13/517,373

(22) PCT Filed: Feb. 15, 2011

(86) PCT No.: PCT/CN2011/070998
§ 371 (c)(1),
(2), (4) Date: Jun. 20, 2012

(87) PCT Pub. No.: WO2011/107004
PCT Pub. Date: Sep. 9, 2011

(65) Prior Publication Data
US 2012/0321313 A1 Dec. 20, 2012

(30) Foreign Application Priority Data
Mar. 2, 2010 (CN) .......................... 2010 1 0133410

(51) Int. Cl.
*H04L 12/26* (2006.01)
*H04J 3/06* (2006.01)
(Continued)

(52) U.S. Cl.
CPC .......... *H04Q 11/0067* (2013.01); *H04J 3/0602* (2013.01); *H04L 1/0041* (2013.01); *H04L 7/048* (2013.01); *H04L 45/00* (2013.01); *H03M 13/1515* (2013.01); *H04L 7/00* (2013.01)

(58) Field of Classification Search
CPC .......... H04J 7/00; H04L 45/00; H04L 7/048; H04Q 11/0067; H03M 13/1515

USPC ........ 398/154, 1, 58; 714/758, 775, 786, 800, 714/707, 752, 784; 370/216, 509; 375/362
See application file for complete search history.

(56) References Cited

U.S. PATENT DOCUMENTS

| 7,376,136 | B2 | 5/2008 | Song et al. | |
|---|---|---|---|---|
| 7,512,867 | B2 * | 3/2009 | Ohira et al. | .................. 714/786 |

(Continued)

FOREIGN PATENT DOCUMENTS

| CN | 101312385 | 11/2008 |
|---|---|---|
| CN | 101409708 | 4/2009 |
| CN | 101455019 | 6/2009 |

OTHER PUBLICATIONS

International Search Report for International Patent Application No. PCT/CN2011/070998 mailed May 26, 2011.

(Continued)

*Primary Examiner* — Alpus H Hsu
*Assistant Examiner* — Camquyen Thai
(74) *Attorney, Agent, or Firm* — McAndrews, Held & Malloy, Ltd.

(57) ABSTRACT

Disclosed in the present invention are a method and apparatus for processing downlink frame synchronization in a Gigabit-capable passive optical network (GPON) system, wherein the method comprises: carrying out forward error correction (FEC) encoding on data in a synchronization domain of a downlink frame of the GPON system, wherein the synchronization domain includes a physical synchronization (Psync) domain and an identifier (Ident) domain; filling the FEC encoded data into an FEC check domain provided in the downlink frame; and sending the downlink frame. By virtue of the present invention, the effect of improving the reliability of GPON downlink frame synchronization is achieved.

10 Claims, 6 Drawing Sheets

(51) Int. Cl.
*H04L 7/04* (2006.01)
*G02F 1/00* (2006.01)
*H04B 10/20* (2006.01)
*G06F 11/00* (2006.01)
*H03M 13/00* (2006.01)
*H04Q 11/00* (2006.01)
*H04L 12/701* (2013.01)
*H04L 1/00* (2006.01)
*H03M 13/15* (2006.01)
*H04L 7/00* (2006.01)

(56) References Cited

U.S. PATENT DOCUMENTS

| | | | |
|---|---|---|---|
| 7,991,296 B1* | 8/2011 | Johnston et al. | 398/154 |
| 8,122,325 B2* | 2/2012 | Effenberger | 714/775 |
| 2005/0149820 A1* | 7/2005 | Gastaldello et al. | 714/758 |
| 2008/0317022 A1 | 12/2008 | Ahmed et al. | |
| 2009/0154916 A1* | 6/2009 | Huang et al. | 398/1 |
| 2009/0276681 A1* | 11/2009 | Ou et al. | 714/752 |
| 2011/0142437 A1* | 6/2011 | Luo et al. | 398/1 |
| 2013/0251362 A1* | 9/2013 | Li et al. | 398/25 |

OTHER PUBLICATIONS

Zhang et al., "New Development of Broadband Access Network—GPON" Communication Information Technology, Apr. 2005, pp. 20-25.

English Abstract: Zhang et al., "New Development of Broadband Access Network—GPON." Communication Information Technology, Apr. 2005, pp. 20-25.

* cited by examiner

METHOD AND APPARATUS FOR PROCESSING DOWNLINK FRAME SYNCHRONIZATION IN GIGABIT-CAPABLE PASSIVE OPTICAL NETWORK SYSTEM

FIELD OF THE INVENTION

The present invention relates to the communication field, and in particular to a method and apparatus for processing downlink frame synchronization in a Gigabit-capable passive optical network (abbreviated as GPON) system.

BACKGROUND OF THE INVENTION

Figure 1:
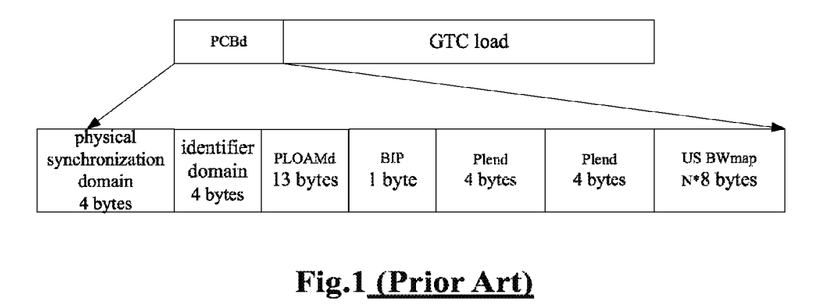
FIG. 1 is a schematic diagram of the frame structure of a downlink frame of a GPON system in relevant art.

FIG. 1 is a schematic diagram of the frame structure of a downlink frame of a GPON system in relevant art, and as shown in FIG. 1, in the GPON protocol, one downlink frame includes two portions, PCBd and GTC payload. In this case, the PCBd is composed of portions such as a physical synchronization (PSync) domain, an identifier (Ident) domain, a PLOAMD domain, wherein the PSync domain is 4 bytes, the default value thereof is 0XB6AB31E0, and the Ident domain is 4 bytes; in order to facilitate to achieve synchronization of downlink frames, scrambling code processing is not carried out on the Psync domain; and when the forward error correction (abbreviated as FEC) encoding is carried out, the data structure of the PCBd domain will not be destructed.

Figure 2:
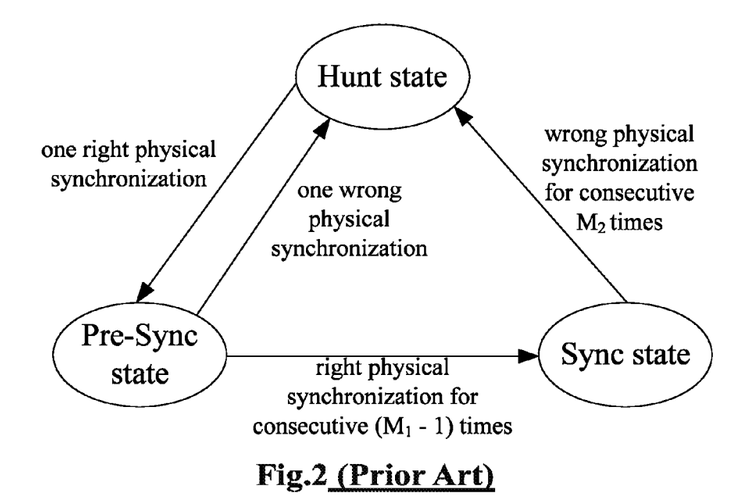
FIG. 2 is a schematic diagram of the state conversion of a synchronization state machine of GPON downlink frames in relevant art.

FIG. 2 is a schematic diagram of the state conversion of a synchronization state machine of GPON downlink frames in relevant art, wherein ONU is under the searching (Hunt) state at the beginning, and under the Hunt state, the ONU hunts for the Psync domain bit by bit and byte by byte. Once a right Psync is found, the ONU enters the pre-synchronization (Pre-Sync) state and sets a counter N=1. Then, the ONU hunts for the next Psync every 125 us. Each time a right Psync is found, the value of the counter increases by 1. If a wrong Psync is found, then the ONU returns to the Hunt state. Under the Pre-Sync state, if the value of the counter is M1, then the ONU enters the synchronization (Sync) state. After having entered the Sync state, the ONU states that the downlink frame structure has been found and starts to process the PCBd information and Payload information; if wrong Psync are detected for consecutive M2 times, then the ONU states that the downlink frame delimitation is lost and returns back to the Hunt state.

Figure 3:
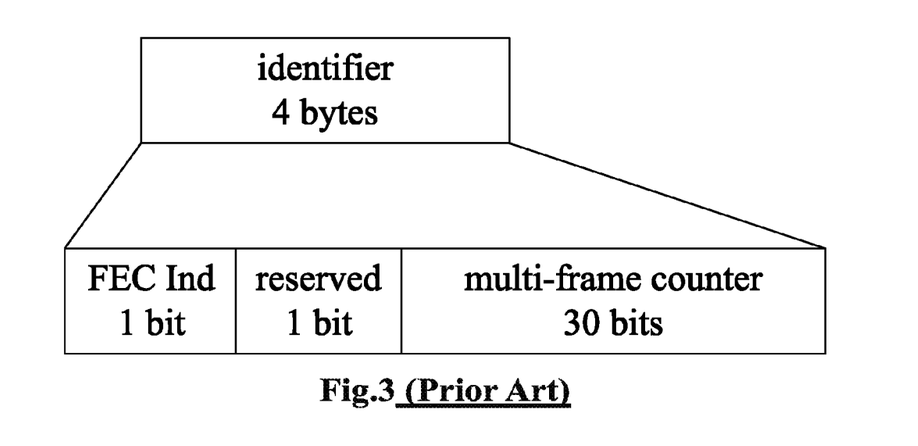
FIG. 3 is a structural schematic diagram of the Ident domain of a GPON downlink frame in relevant art.

FIG. 3 is a structural schematic diagram of the Ident domain of the GPON downlink frame in relevant art, and as shown in FIG. 3, lower 30 bits in 4 bytes of the Ident domain are a multi-frame counter, the counting value of the Ident domain of each frame is bigger than a previous frame by 1, and when the counter reaches the maximum, the next frame is set as zero. The multi-frame counter can be used for encrypting the user data and can also be used for providing a synchronization reference signal with relatively low rate to the system. In order to tolerate errors for the Ident domain, the ONU has to implement a local multi-frame counter and a multi-frame synchronization state machine. The multi-frame synchronization state machine is the same as the synchronization state machine described in the Psync domain. Under the Hunt state, the ONU loads the received multi-frame counter in the Ident domain into the local counter. Under the Pre-sync and Sync states, the ONU compares the local value and the received value of the counter, if they are matched with each other, then it indicates that the downlink frame synchronization is right, and if they are mismatched, then it indicates that the downlink frame is asynchronous or the transmission is wrong.

In the GPON system, the transmission rate is relatively low, however, in the 10 G GPON, the downlink rate is increased from the original 2.5 Gbps to 10 Gbps, and the bit error rate of the frame header during transmission will be greatly increased, and when the number of errors of the Psync domain or Ident domain accumulates to a certain number, the ONU will enter an asynchronous state, which will cause instant breaking of the ONU downlink data, thus affecting the normal operating of the whole GPON system.

As to the problem in relevant art that in the GPON system since the bit error rate of the frame header is relatively high, it causes the optical network terminal to enter the asynchronous state and causes the reliability of system transmission data to be relatively poor, currently still no effective solution is proposed.

SUMMARY OF THE INVENTION

The main object of the present invention is to provide a method and apparatus for processing downlink frame synchronization in a GPON system so as to solve the above problems.

A method for processing downlink frame synchronization in a GPON system is provided according to one aspect of the present invention, which method comprises: carrying out forward error correction (FEC) encoding on data in a synchronization domain of a downlink frame of the GPON system, wherein the synchronization domain includes a physical synchronization (Psync) domain and an identifier (Ident) domain; filling the FEC encoded data into an FEC check domain provided in the downlink frame; and sending the downlink frame.

After sending the downlink frame, the above method further comprises: receiving the downlink frame and checking the data in the synchronization domain in the downlink frame structure according to the above FEC encoded data; and processing the frame synchronization of the downlink frame according to the check result.

The step of checking the data in the synchronization domain in the downlink frame structure according to the above FEC encoded data comprises: when a synchronization state machine of a GPON system optical network terminal detects a wrong Psync value, carrying out FEC check on the data of the Psync domain in the downlink frame structure; and comparing a Psync value obtained by carrying out the FEC check on the data of the Psync domain with a preset Psync value, if they are the same, then feeding back right information to the synchronization state machine; otherwise feeding back error information.

The step of processing the frame synchronization of the downlink frame according to the check result comprises: after the information of the FEC check is received, judging the state of the synchronization state machine, if it is under a pre-synchronization state (Pre-Sync) and the right information is received, then a right_cnt counter increasing by 1; and if it is under a synchronization state and the error information is received, then an error_cnt counter increasing by 1.

The step of checking the synchronization domain data in the downlink frame structure according to the FEC encoded data comprises: when the counting value of a multi-frame counter of the GPON system optical network terminal is mismatched with that of a local counter, checking the Ident domain in the downlink frame structure; and detecting, by the synchronization state machine of the GPON system optical network terminal, that the counting value of the multi-frame counter obtained by checking the Ident domain is compared with the counting value of the local counter, if they are the same, then feeding back right information to the synchronization state machine; otherwise feeding back error information.

The step of processing the frame synchronization of the downlink frame according to the check result comprises: after the information of the FEC check is received, judging the state of the synchronization state machine, if it is under a pre-synchronization state (Pre-Sync) and the right information is received, then a right_cnt counter increasing by 1; and if it is under a synchronization state and the error information is received, then an error_cnt counter increasing by 1.

The FEC check domain is 16 bytes and uses the encoding format of Reed Solomon code RS (255, 239).

An optical line terminal for a Gigabit-capable passive optical network system is provided according to another aspect of the present invention, which terminal comprising: an encoding module, configured to carry out forward error correction (FEC) encoding on data in a synchronization domain of a downlink frame of the GPON system, wherein the synchronization domain includes a Psync domain and an Ident domain; a filling module, configured to fill the FEC encoded data generated by the encoding module into an FEC check domain provided in the downlink frame; and a sending module, configured to send the downlink frame.

The FEC check domain is 16 bytes and uses the encoding format of Reed Solomon code RS (255, 239).

An optical network terminal for a Gigabit-capable passive optical network system is provided according to yet another aspect of the present invention, which terminal comprising: a receiving module, configured to receive the downlink frame sent by the sending module; a checking module, configured to check the data in the synchronization domain of the downlink frame structure according to the FEC encoded data received by the receiving module; and a processing module, configured to process the frame synchronization of the downlink frame according to the check result of the checking module.

By virtue of the present invention, forward error correction (FEC) encoding is carried out on the data in the synchronization domain of the downlink frame of the GPON system, wherein the synchronization domain includes a physical synchronization (Psync) domain and an identifier (Ident) domain; the FEC encoded data are filled into an FEC check domain provided in the downlink frame; and the downlink frame is sent out, which solves the problem in relevant art that in the GPON system since the bit error rate of the frame header is relatively high, it causes the optical network terminal to enter the asynchronous state and causes the reliability of system transmission data to be relatively poor, thus achieving the effect of improving the reliability of GPON downlink frame synchronization.

BRIEF DESCRIPTION OF THE DRAWINGS

The drawings illustrated here provide a further understanding of the present invention and form a part of the present application. The exemplary embodiments and the description thereof are used to explain the present invention without unduly limiting the scope of the present invention. In the drawings.

DETAILED DESCRIPTION OF EMBODIMENTS

The present invention will be described hereinafter in detail with reference to the accompanying drawings and in conjunction with embodiments. It needs to note that the embodiments of the present application and the features in the embodiments can be combined with each other if there is no conflict.

Figure 4:
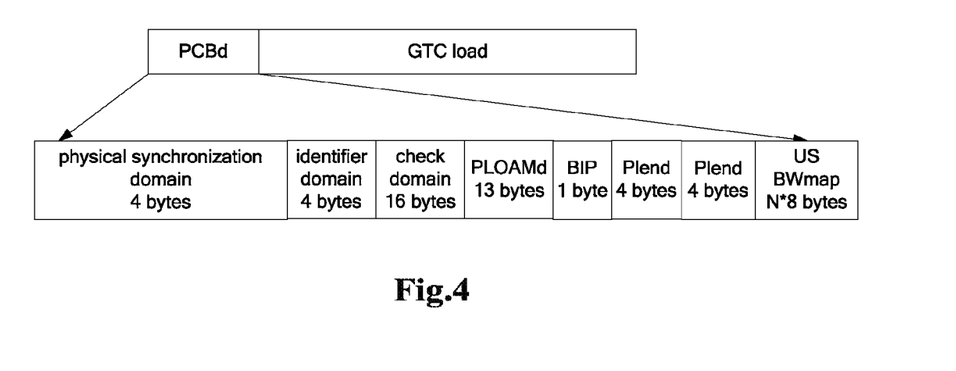
FIG. 4 is a schematic diagram of the frame structure of a 10 G GPON downlink frame according to the embodiments of the present invention.

FIG. 4 is a schematic diagram of the frame structure of a 10 G GPON downlink frame according to the embodiments of the present invention, and as shown in FIG. 4, the downlink frame structure of the GPON is improved, and the new frame structure is added with a 16-bit FEC check domain (Parity) and uses the encoding processing mode of Reed-Solomon code RS (255, 239) for carrying out FEC encoding processing on a 4-byte Psync domain and a 4-byte Ident domain (collectively referred to as synchronization domain hereinafter), (that is, no matter whether the downlink FEC encoding function is opened, the optical line terminal (abbreviated as OLT) has to carry out FEC encoding processing on the 8-byte synchronization domain to generate 16-byte check data and fill the check data into the Parity domain of the frame structure, and when the synchronization state machine of the ONU detects a wrong Psync frame header, it has to apply for carrying out FEC decoding on the synchronization domain. In this way, when the downlink FEC function is opened, the FEC encoding no longer starts from the Psync domain but starts from the PLOAMd domain for encoding with the unit of 239 bytes). At the same time, the 16-byte check data of the Parity domain can correct most errors which occur during the transmission of Psync domain and Ident domain.

Since in the GPON system, the encoding mode of FEC downlink is RS (255, 239), the FEC encoding of the synchronization domain also uses this encoding mode, which can reduce additional research and development costs. In addition, RS (255, 239) has rather strong error correction performance and can correct 8-byte transmission error. Therefore, as long as less than 9-byte bit error occurs during the transmission of the 8-byte synchronization domain and the 16-byte Parity domain, the Parity domain data decoded by the FEC should be 0XB6AB31E0 all the time, so that the ONU system can continuously maintain the synchronization of downlink frame. In the 10 G GPON, the frame length of the downlink frame is 155520, and only a 16-byte Parity domain overhead is added in the frame header, which has little effect on system bandwidth.

Figure 5:
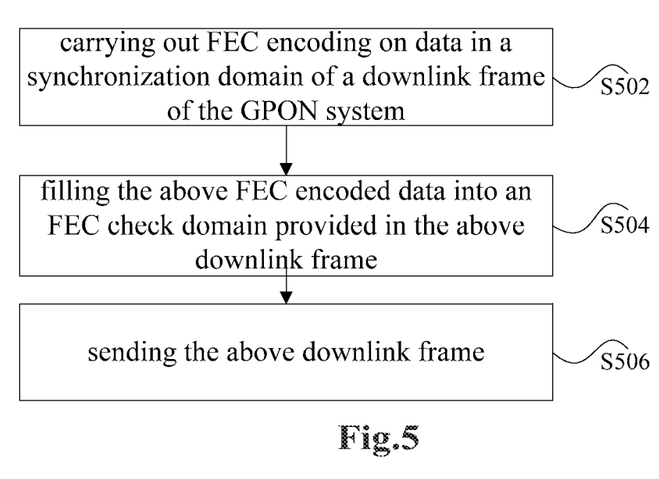
FIG. 5 is a flow chart of a method for processing downlink frame synchronization of a GPON system according to the embodiments of the present invention.

FIG. 5 is a flow chart of a method for processing downlink frame synchronization of a GPON system according to the embodiments of the present invention, comprising:

Step S502: carrying out FEC encoding on data in a synchronization domain of a downlink frame of the GPON system, wherein the above synchronization domain includes a Psync domain and an Ident domain;

Step S504: filling the above FEC encoded data into an FEC check domain provided in the downlink frame; and Step S506: sending the above downlink frame.

Preferably, the FEC encoded data in step S502 are filled into the Parity domain of the frame structure of the downlink frame as shown in FIG. 4.

After step S506, the above method further comprises: receiving the downlink frame, and checking the data in the synchronization domain in the downlink frame structure according to the above FEC encoded data; and processing the frame synchronization of the downlink frame according to the check result.

Preferably, the step of checking the data in the synchronization domain in the downlink frame structure according to the FEC encoded data comprises: when a synchronization state machine of a GPON system optical network terminal detects a wrong Psync value, carrying out FEC check on the data of the Psync domain in the downlink frame structure; and comparing a Psync value obtained by carrying out FEC check on the data of the Psync domain with a preset Psync value, if they are the same, then feeding back right information to the synchronization state machine; otherwise feeding back error information.

Preferably, the step of processing the frame synchronization of the downlink frame according to the check result comprises: after the information of the FEC check is received, judging the state of the synchronization state machine, if it is under a pre-synchronization state (Pre-Sync) and the right information is received, then a right_cnt counter increases by 1; and if it is under a synchronization state and the error information is received, then an error_cnt counter increases by 1.

Preferably, the step of checking the above synchronization domain data in the downlink frame structure according to the above FEC encoded data comprises: when the counting value of a multi-frame counter of the GPON system optical network terminal is mismatched with that of a local counter, checking the Ident domain in the downlink frame structure; and the synchronization state machine of the GPON system optical network terminal detects that the counting value of the multi-frame counter obtained by checking the Ident domain is compared with that of the local counter, if they are the same, then feeding back right information to the above synchronization state machine; otherwise feeding back error information.

Preferably, the step of carrying out the frame synchronization of the downlink frame according to the check result comprises: after the information of the above FEC check is received, judging the state of the synchronization state machine, if it is under a pre-synchronization state (Pre-Sync) and the right information is received, then a right_cnt counter increases by 1; and if it is under a synchronization state and the error information is received, then an error_cnt counter increases by 1.

Figure 6:
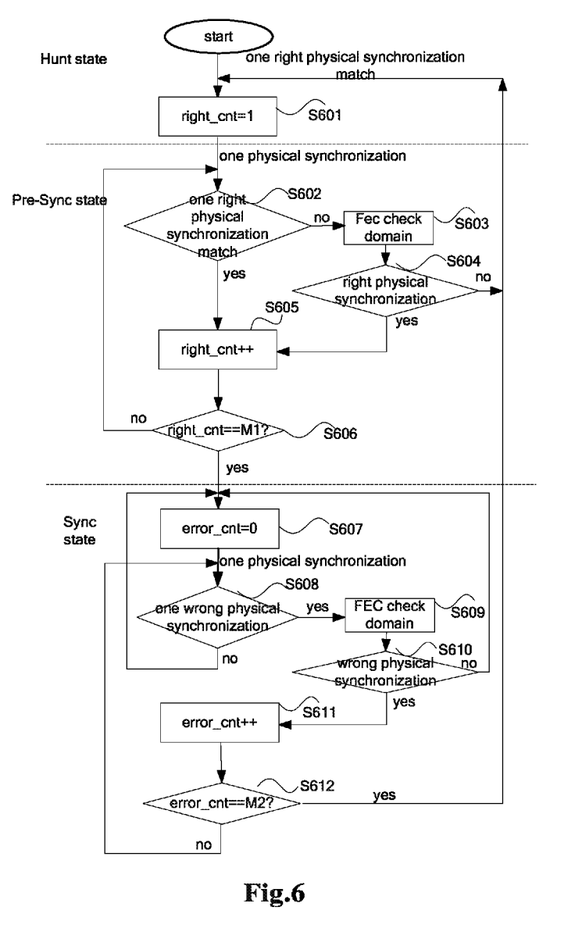
FIG. 6 is a flow chart of the synchronization processing of a 10 G GPON downlink frame according to the embodiments of the present invention.

FIG. 6 is a flowchart of 10 G GPON downlink frame synchronization according to the embodiments of the present invention, comprising:

when the ONU carries out downlink frame synchronization, it does not need to apply for carrying out FEC check on the synchronization domain each time, and only apply for carrying out FEC decoding (FEC check) on the Psync domain when it is found that the Psync domain went wrong.

Step S601: the synchronization state machine is under the searching (Hunt) state, hunts for the Psync domain in the downlink frame, locks a data offset parameter offset after having found a right frame header, enters the pre-synchronization (Pre-Sync) state, and sets the right_cnt counter as 1.

Step S602: hunting for the next Psync every 125 us and carrying out the match check for the Psync with a preset value.

Preferably, the Psync domain decoded by the FEC is compared with the preset data 0XB6AB31E0.

Step S603: if a wrong Psync is found, then first applying for an FEC check.

Step S604: if a right Psync can be checked by an FEC encoding module, then it feeds back right information to the synchronization state machine and the step S605 is to be executed; and if a wrong Psync is detected, then it feeds back error information to the synchronization state machine and the synchronization state machine returns back to the Hunt state.

Step S605: the value of the right_cnt counter increases by 1.

Step S606: if the value of the right_cnt counter reaches to M1, then entering the synchronization (Sync) state.

Step S607: the synchronization state machine is under the synchronization (Sync) state, and error_cnt=0.

Step S608: under the synchronization (Sync) state, the ONU detects a wrong Psync.

Step S609: applying for carrying out FEC check.

Step S610: if a right Psync can be checked by the FEC encoding module, then the error_cnt counter resets and the synchronization (Sync) state is maintained continuously; and if the check goes wrong, then to the step S611 is to be excuted.

Step S611: the value of the error_cnt counter increases by 1.

Step S612: when the value of the error_cnt counter reaches to M2, re-entering the Hunt state, so that the ONU system will be under the LOF state again and needs to re-carry out downlink frame synchronization.

Figure 7:
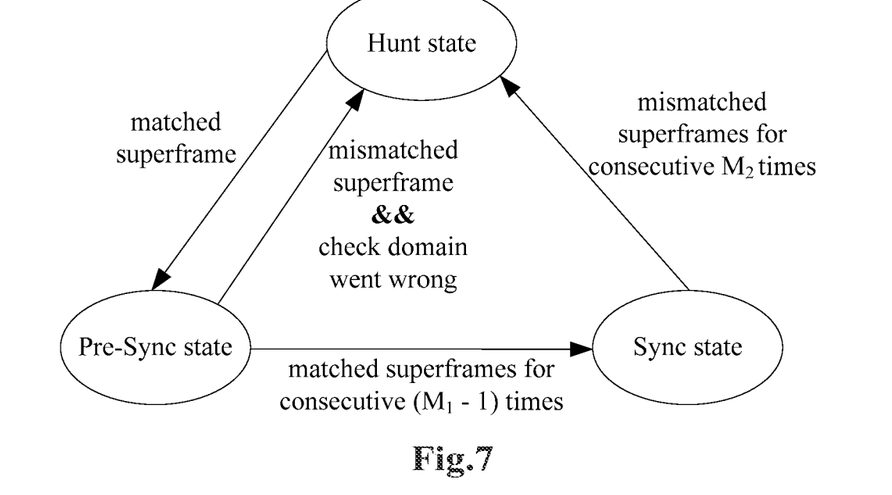
FIG. 7 is a schematic diagram of state conversion of a multi-frame counter synchronization state machine of the 10 G GPON downlink frame according to the embodiments of the present invention.

FIG. 7 is a schematic diagram of state conversion of a multi-frame counter synchronization state machine of the 10 G GPON downlink frame according to the embodiments of the present invention, and as shown in FIG. 7:

Under the Hunt state, the ONU loads the received multi-frame counter in the Ident domain into the local counter. Under the pre-synchronization and synchronization states, the ONU compares the local value and the received counter value, wherein if they are matched with each other, it indicates that the synchronization is right, and if they are mismatch, it indicates that the transmission is wrong or asynchronous. When they are mismatch, it firstly needs to apply for the FEC check, and if a right or wrong counting value of the multi-frame counter can be checked, then the corresponding right_cnt or error_cnt counter increases by 1.

Under the Hunt state, when one matched value is hunted, then entering the pre-synchronization state, otherwise returning to the Hunt state, and if the matched results are hunted for consecutive M1 times, then the synchronization state is entered.

Under the synchronization state, if the mismatched results, are hunted for consecutively M2 times, then returning back to the Hunt state.

By virtue of this embodiment, the protection to the Ident domain data by the Parity domain is achieved, and when the multi-frame counter is used to carry out synchronization, a stable multi-frame counter is obtained, so as to better ensure the reliability of the ONU downlink AES decryption.

By virtue of the above processing method, we can make the ONU to maintain synchronization as much as possible when the Psync is wrong under the premise that synchronization can be maintained when the Psync is right, which improves the reliability of the system. Of course, the 16-byte Parity domain also will go wrong during transmission, however, if Parity is right at this moment, then the state of the ONU will still not be affected, unless both the Psync domain and Parity domain go wrong, which can only indicate that the channel of the PCBd domain is already very poor, and this problem cannot be solved by the FEC.

Figure 8:
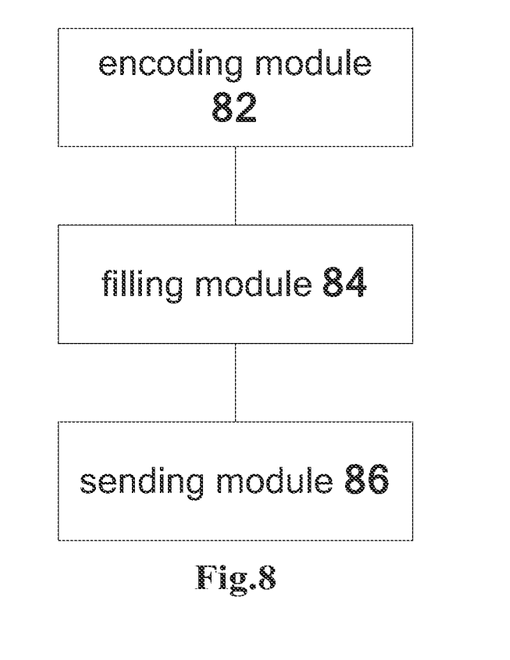
FIG. 8 is a structural block diagram of an OLT for a 10 G GPON system according to the embodiments of the present invention.

FIG. 8 is a structural block diagram of an OLT for a 10 G GPON system according to the embodiments of the present invention, and as shown in FIG. 8, it comprises:

an encoding module 82 for carrying out forward error correction (FEC) encoding on data in a synchronization domain of a downlink frame of the GPON system, wherein the synchronization domain includes a Psync domain and an Ident domain; a filling module 84, connected to the encoding module 82, for filling the FEC encoded data generated by the encoding module 82 into an FEC check domain provided in the downlink frame; and a sending module 86, connected to the filling module 84, for sending the downlink frame filled by the filling module 84.

Figure 9:
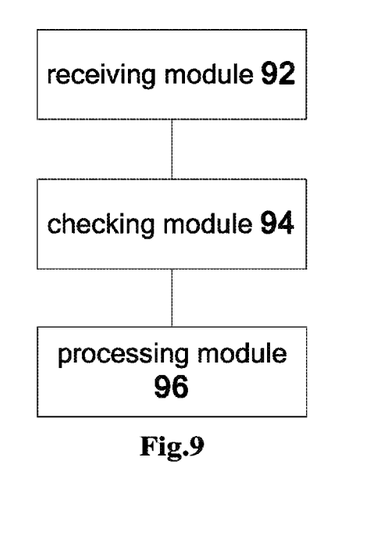
FIG. 9 is a structural block diagram of an ONU for a 10 G GPON system according to the embodiments of the present invention.

FIG. 9 is a structural block diagram of an ONU for a 10 G GPON system according to the embodiments of the present invention, and as shown in FIG. 9, hereinafter the above structures will be described in detail:

a receiving module 92, connected to the sending module 86, is used for receiving the downlink frame sent by the sending module; a checking module 94, connected to the receiving module 92, is used for checking the data in the synchronization domain of the downlink frame structure according to the FEC encoded data received by the receiving module 92; and a processing module 96, connected to the checking module 94, is used for processing the frame synchronization of the downlink frame according to the check result of the checking module 94.

Figure 10:
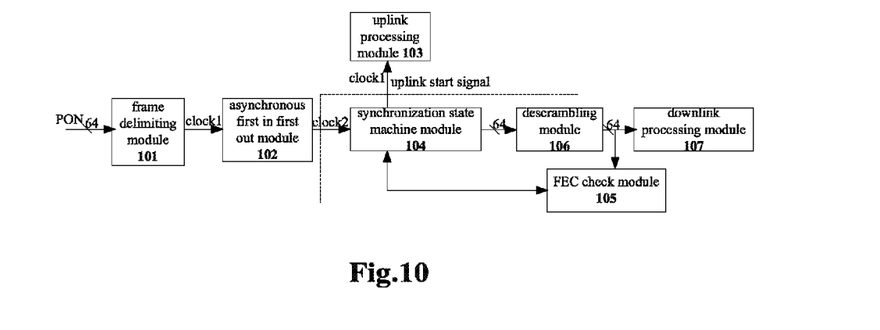
FIG. 10 is a structural block diagram of hardware implementation of the synchronization processing of the 10 G GPON downlink frame according to the embodiments of the present invention.

FIG. 10 is a structural block diagram of hardware of the ONU of the 10 G GPON system according to the embodiments of the present invention, and as shown in FIG. 10, it comprises: a frame delimiting module 101 (equivalent to the receiving module 92 in FIG. 9), an asynchronous first in first out module 102, an uplink processing module 103, a synchronization state machine module 104 (equivalent to the processing module 96 in FIG. 9), an FEC check module 105 (equivalent to the checking module 94 in FIG. 9), a descrambling module 106, and a downlink processing module 107, and hereinafter the above structures will be described in detail:

as shown in FIG. 10, the 9.952 Gbps serial data inputted at the PON port side generate 155.52 MHz parallel data with the bit width of 64 bits after the serial-parallel conversion. First of all, the 64-bit data are sent into the frame delimiting module 101 for delimiting the location of the frame header and the offset, so that it can be ensured that the highest byte MSB in the 64-bit data sent by the frame delimiting module is the first byte 0XB6 in the 0XB6AB31E0 data. Then, the data are sent into the asynchronous FIFO module 102, the input clock clk1 of which module is 155.52 MHz and the output clock clk2 can be the operating clock of the ONU system and can be 156.25 MHz, so that the downlink data can be synchronous with the operating clock of the ONU system and the following processing can be designed according to the principle of synchronous circuit.

Then, the data enter the synchronization state machine module 104, which module mainly implements the function of the synchronization state machine shown in FIG. 7. After the synchronization state machine detects the frame header for the first time and enters the Pre-Sync state, it needs an internal counter to count the downlink frames and the counter is reset every 125 us. After having entered the Pre-Sync state, the moment of reset is exactly the coming moment of the Psync, and at this moment it requires to judge whether the data at this moment is 0XB6AB31E0; if they are mismatched with each other, then it needs to apply to FEC check module 105 for the synchronization domain check; the descrambling processing is needed to be performed for the input data of FEC check module 105 at first, and then FEC decoding can be performed for the input data. Since the time for checking the synchronization domain by the FEC check module 105 is fixed, which is about more than four hundred clock cycle, and there is a long time before the coming of the next Psync, therefore the synchronization state machine has enough time to process the check result of the FEC check module 105. Furthermore, at the moment of reset, the synchronization state machine module 104 further needs to send an up_start indication signal to the ONU uplink processing module 103 for indicating the initial time of the ONU uplink, and the uplink processing module 103 works in the clk1 clock domain. The up_start signal can be given out when the synchronization state machine is under the Sync state, and when the synchronization state machine is under the Sync state, even if the Psync is mismatched with the 0XB6AB31E0, it still needs to give the indication signal, because it is possible that the FEC check module 105 can correct the error of the Psync.

The synchronization state machine module 104 reads out the data of the asynchronous FIFO module 102 by frame regardless of the state of the synchronization state machine and sends them into the descrambling module 106 for descrambling processing. When the synchronization state machine is under the Sync state, the data outputted by the descrambling module 106 will be sent to the downlink processing module 107 for GTC de-frame and GEM de-frame processing; and when the synchronization state machine is under the Hunt state or Pre-Sync state, the data outputted by the descrambling module 106 will be discarded.

In the present invention, a 16-byte Parity domain is introduced on the basis of the frame structure of GPON downlink frame, which effectively protects the synchronization domain of 10 G GPON downlink frame and improves the reliability of downlink frame synchronization when the downlink data traffic is 10 Gbps, avoids the breaking when the channel is interfered strongly as much as possible, makes the downlink frame synchronization be maintained as much as possible when severe changes occur in the channel, and makes the system be able to work normally.

Obviously, those skilled in the art should understand that the above module or steps of the present invention can be implemented using a general-purpose computing apparatus, and they can be integrated on a single computing apparatus or distributed over a network consisted of multiple computing apparatus; optionally, they can be implemented using computing apparatus executable program code, thus, they can be stored in a storage for being executed by the computing apparatus, and in some cases, the shown or described steps can be performed in an order different from the order here, or they can be made into various integrated circuit modules respectively, or some modules or steps therein are made into a single integrated circuit module for implementation. In this way, the present invention is not limited to any particular combination of hardware and software.

Above description is only to illustrate the preferred embodiments but not to limit the present invention. Various alternations and changes to the present invention are apparent to those skilled in the art. The scope defined in claims shall comprise any medication, equivalent substitution and improvement within the spirit and principle of the present invention.

What is claimed is:

1. A method for processing downlink frame synchronization in a Gigabit-capable passive optical network system, comprising the following steps:
   carrying out forward error correction (FEC) encoding on data in a synchronization domain of a downlink frame of the Gigabit-capable passive optical network (GPON) system, wherein the synchronization domain includes a physical synchronization (Psync) domain and an identifier (Ident) domain;
   filling the FEC encoded data into an FEC check domain provided in the downlink frame; and
   sending the downlink frame;
   wherein after sending the downlink frame, the method further comprises:
   receiving the downlink frame and checking the data in the synchronization domain in the downlink frame structure according to the FEC encoded data; and
   processing the frame synchronization of the downlink frame according to the check result;
   wherein the step of checking the data in the synchronization domain in the downlink frame structure according to the FEC encoded data comprises:
   when a synchronization state machine of a GPON system optical network terminal detects a wrong Psync value, carrying out FEC check on the data of the Psync domain in the downlink frame structure; and
   comparing a Psync value obtained by carrying out the FEC check on the data of the Psync domain with a preset Psync value, if they are the same, then feeding back right information to the synchronization state machine; otherwise feeding back error information.

2. The method according to claim 1, wherein the step of processing the frame synchronization of the downlink frame according to the check result comprises: after the information of the FEC check is received, judging the state of the synchronization state machine, if it is under a pre-synchronization (Pre-Sync) state and the right information is received, then a right_cnt counter increasing by 1; and if it is under a synchronization state and the error information is received, then an error_cnt counter increasing by 1.

3. The method according to claim 1, wherein the step of checking the synchronization domain data in the downlink frame structure according to the FEC encoded data comprises:
   when the counting value of a multi-frame counter of the GPON system optical network terminal is mismatched with that of a local counter, checking the Ident domain in the downlink frame structure; and
   detecting, by the synchronization state machine of the GPON system optical network terminal, that the counting value of the multi-frame counter obtained by checking the Ident domain is compared with the counting value of the local counter, if they are the same, then feeding back right information to the synchronization state machine; otherwise feeding back error information.

4. The method according to claim 3, wherein the step of processing the frame synchronization of the downlink frame according to the check result comprises: after the information of the FEC check is received, judging the state of the synchronization state machine, if it is under a pre-synchronization (Pre-Sync) state and the right information is received, then a right_cnt counter increasing by 1; and if it is under a synchronization state and the error information is received, then an error_cnt counter increasing by 1.

5. The method according to claim 1, wherein the FEC check domain is 16 bytes and uses the encoding format of Reed Solomon code RS (255, 239).

6. An optical line terminal for a Gigabit-capable passive optical network system, comprising:
   an encoding module, configured to carry out forward error correction (FEC) encoding on data in a synchronization domain of a downlink frame of the Gigabit-capable passive optical network (GPON) system, wherein the synchronization domain includes a Psync domain and an Ident domain;
   a filling module, configured to fill the FEC encoded data generated by the encoding module into an FEC check domain provided in the downlink frame; and
   a sending module, configured to send the downlink frame;
   wherein the terminal further comprises:
   a receiving module, configured to receive the downlink frame sent by the sending module;
   a checking module, configured to check the data in the synchronization domain of the downlink frame structure according to the FEC encoded data received by the receiving module; and
   a processing module, configured to process the frame synchronization of the downlink frame according to the check result of the checking module;
   wherein the checking module is further configured to:
   when a synchronization state machine of a GPON system optical network terminal detects a wrong Psync value, carry out FEC check on the data of the Psync domain in the downlink frame structure; and
   compare a Psync value obtained by carrying out the FEC check on the data of the Psync domain with a preset Psync value, if they are the same, then feed back right information to the synchronization state machine; otherwise feed back error information.

7. The optical line terminal according to claim 6, wherein the FEC check domain is 16 bytes and uses the encoding format of Reed Solomon code RS (255, 239).

8. The method according to claim 2, wherein the FEC check domain is 16 bytes and uses the encoding format of Reed Solomon code RS (255, 239).

9. The method according to claim 3, wherein the FEC check domain is 16 bytes and uses the encoding format of Reed Solomon code RS (255, 239).

10. The method according to claim 4, wherein the FEC check domain is 16 bytes and uses the encoding format of Reed Solomon code RS (255, 239).

* * * * *